United States Patent
Troy et al.

(10) Patent No.: US 8,732,549 B2
(45) Date of Patent: *May 20, 2014

(54) DATA RECOVERY IN A SOLID STATE STORAGE SYSTEM

(71) Applicant: Micron Technology, Inc, Boise, ID (US)

(72) Inventors: Larsen Troy, North Ogden, UT (US); Martin Culley, Boise, ID (US); Troy Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,934

(22) Filed: Nov. 16, 2012

(65) Prior Publication Data

US 2013/0080860 A1 Mar. 28, 2013

Related U.S. Application Data

(63) Continuation of application No. 12/424,766, filed on Apr. 16, 2009, now Pat. No. 8,327,224.

(51) Int. Cl.
*H03M 13/00* (2006.01)

(52) U.S. Cl.
USPC .......................................................... 714/763

(58) Field of Classification Search
USPC ............... 714/5.11, 6.1, 6.11, 6.12, 6.2, 6.21, 714/6.22, 6.32, 42, 54, 763, 764, 766, 770
See application file for complete search history.

(56) References Cited

U.S. PATENT DOCUMENTS

| | | | |
|---|---|---|---|
| 6,397,365 B1 | 5/2002 | Brewer et al. | |
| 7,383,472 B2 * | 6/2008 | Miura | 714/42 |
| 7,774,643 B2 | 8/2010 | Wang | |
| 8,010,876 B2 | 8/2011 | Hsieh et al. | |
| 8,261,124 B2 * | 9/2012 | Carmichael | 714/6.24 |
| 8,327,224 B2 * | 12/2012 | Larsen et al. | 714/763 |
| 8,438,455 B2 * | 5/2013 | Vogan et al. | 714/764 |
| 2005/0154826 A1 * | 7/2005 | Marks et al. | 711/114 |
| 2007/0136525 A1 | 6/2007 | Read | |
| 2008/0065937 A1 | 3/2008 | Micheloni et al. | |
| 2008/0189466 A1 * | 8/2008 | Hemmi | 711/4 |
| 2008/0250270 A1 | 10/2008 | Bennett | |
| 2008/0288814 A1 * | 11/2008 | Kitahara | 714/5 |
| 2009/0164836 A1 * | 6/2009 | Carmichael | 714/6 |
| 2009/0327803 A1 | 12/2009 | Fukutomi et al. | |
| 2010/0017649 A1 * | 1/2010 | Wu et al. | 714/6 |
| 2010/0115376 A1 | 5/2010 | Shalvi et al. | |

* cited by examiner

*Primary Examiner* — Nadeem Iqbal

(74) *Attorney, Agent, or Firm* — Dicke, Billig & Czaja, PLLC

(57) ABSTRACT

Methods for data recovery and memory systems are provided. According to at least one such method, when defective data is read from a memory location, the data is recovered by an XOR operation on the remaining good data and associated RAID data to reconstruct the defective data. The defective data is excluded from the XOR operation.

19 Claims, 7 Drawing Sheets

US 8,732,549 B2

DATA RECOVERY IN A SOLID STATE STORAGE SYSTEM

RELATED APPLICATION

This is a continuation of U.S. application Ser. No. 12/424,766, titled "DATA RECOVERY IN A SOLID STATE STORAGE SYSTEM," filed Apr. 16, 2009 and issued as U.S. Pat. No. 8,327,224 on Dec. 4, 2012, which is commonly assigned and incorporated herein by reference.

TECHNICAL FIELD

The present invention relates generally to memory and in a particular embodiment the present invention relates to non-volatile memory.

BACKGROUND

Memory is typically provided as internal, semiconductor, integrated circuits in computers or other electronic devices. There are many different types of memory including random access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array that includes a large number of memory cells. Each of the memory cells includes a floating gate field-effect transistor capable of holding a charge. The cells are usually grouped into blocks of 64 pages of single level cells (SLC) or 128 pages of multilevel cells (MLC), where each page is typically 2048 bytes of data on 32 word lines. Each of the cells within a block can be electrically programmed on a random basis by charging the floating gate.

Non-volatile memory can be incorporated into solid state storage devices such as solid state drives. Solid state drives, incorporating a large number of individual non-volatile memory devices, such as a large number of memory die, can be used to replace the hard disk drives in computers that typically use magnetic or optical disks for storing large amounts of data. A solid state drive does not use moving parts whereas a hard disk drive requires a complex and sensitive drive and read/write head assembly to interact with the magnetic/optical disk. Thus, the solid state drives are more resistant to damage and loss of data through vibration and impacts.

As with most semiconductor memory, non-volatile memory can have a number of failed memory locations (e.g., bad cells, bad pages, bad blocks, etc.). The failed memory locations may be defectively fabricated or can also fail during use. If a memory location fails during operation, the data stored in that location or locations may be lost.

For the reasons stated above, and for other reasons stated below which will become apparent to those skilled in the art upon reading and understanding the present specification, there is a need in the art for a way to recover data from defective memory locations.

DETAILED DESCRIPTION

Figure 1:
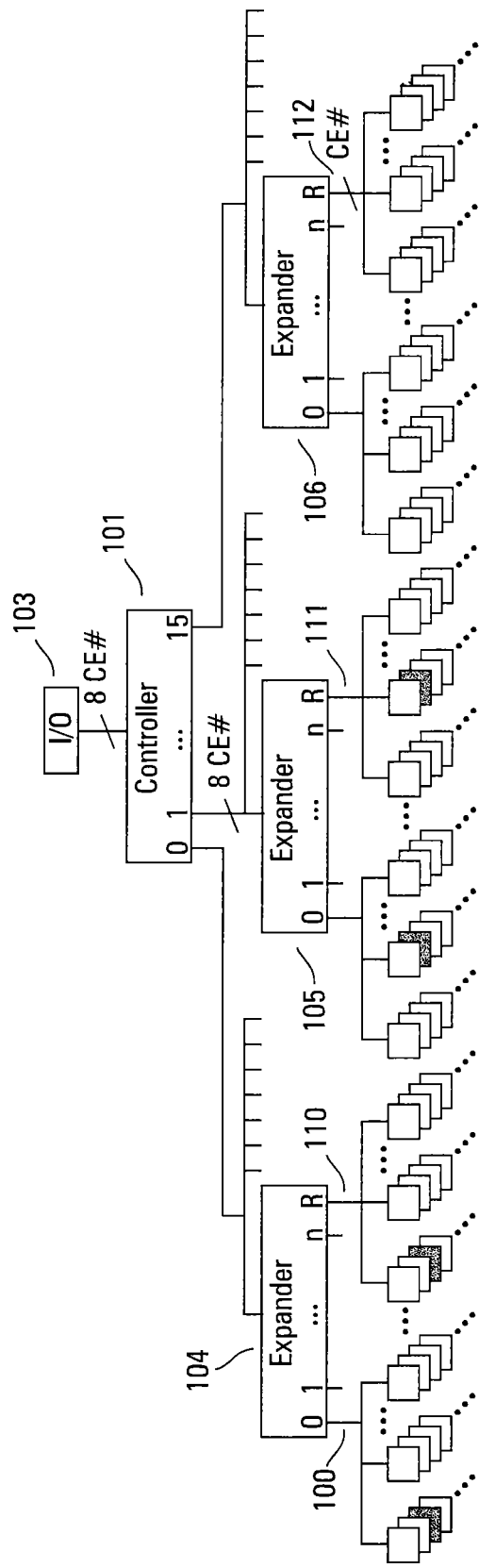
FIG. 1 shows a block diagram of one embodiment of a solid state storage system.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of a solid state storage system, such as a solid state drive, that incorporates non-volatile memory. Such a system can emulate a hard disk drive in a computer system. Alternate embodiments can use the solid state storage system in other applications.

The memory system is comprised of a system controller 101 that controls operation of the solid state storage system and enables the system to emulate a hard disk drive as well as perform other tasks. The controller 101 has a plurality of communication channels that allow it to communicate with and control a plurality of memory targets. In the illustrated embodiment, the controller 101 has 16 communication channels and each communication channel is comprised of eight chip enables (i.e., $\overline{CE0}$-$\overline{CE7}$).

The controller 101 is coupled to an I/O interface 103 such as a peripheral component interconnect express (PCIe) interface or some other interface. The I/O interface 103 enables the controller 101 to communicate with external systems, such as a computer system, by handling standardized bus communication signals between the solid state storage system and the external system.

The controller 101 is also coupled to a plurality of expander blocks 104-106 that expand the communication channels usable by the controller 101. Each communication channel from the controller 101 can be coupled to a respective one of eight different expander blocks. Each expander block, such as blocks 104-106, has multiple communication channels 100, where each of the expander block communication channels 100 can be coupled to multiple memory targets. One example of such an expander block communication channel 100 is illustrated in FIG. 2 that is described subsequently.

An expander block communication channel might contain a plurality of distinct chip enable signals, such as $\overline{CE0}$-$\overline{CE7}$. Each of these chip enable signals may in turn be coupled to a respective one of a plurality of memory targets 201-208. A memory target can refer to one or more logical units (LUNs) of memory. In some embodiments, a memory target might be a single memory package that includes multiple LUNs. Typically, a LUN corresponds to a single memory device, such as a single die.

Figure 2:
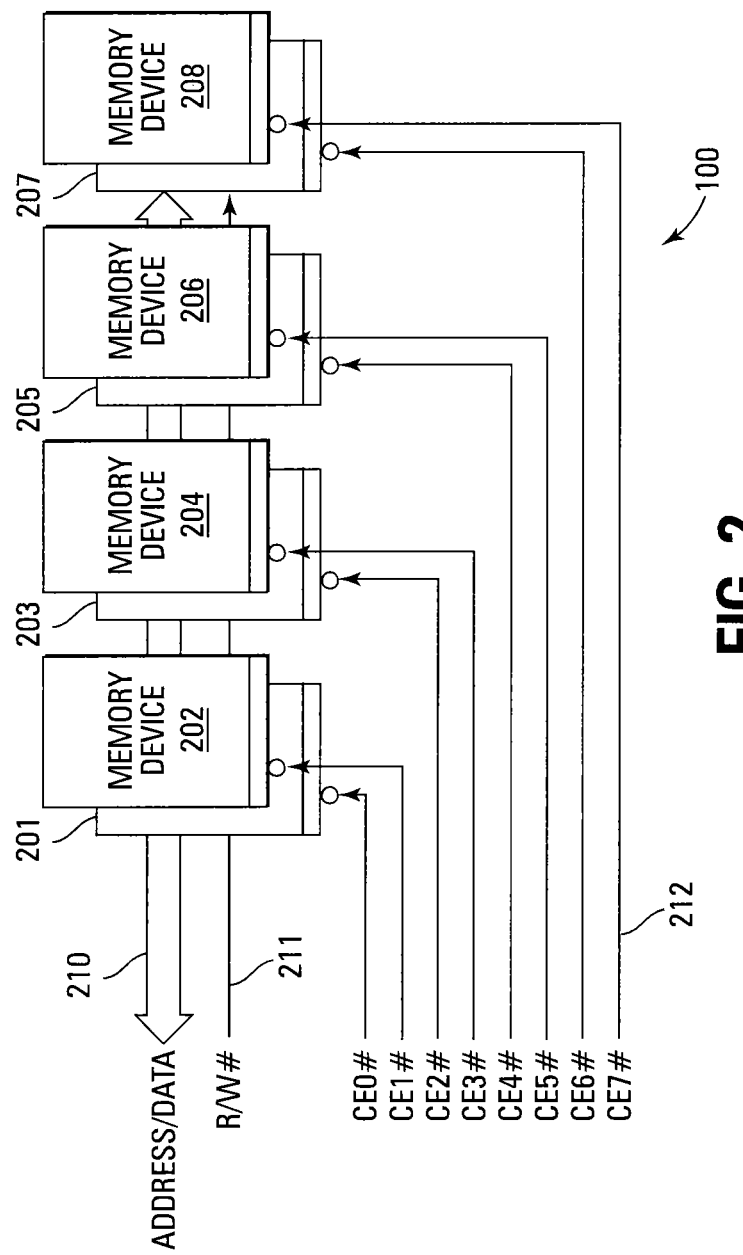
FIG. 2 shows a block diagram of one embodiment of a memory communication channel coupled to a plurality of memory devices in accordance with the solid state storage system of FIG. 1.

FIG. 2 depicts an embodiment where an expander block communication channel 100 consists of eight chip enable signals respectively coupled to eight memory targets 201-208, where each of the depicted memory targets corresponds to a single memory device. LUN can also contain multiple planes of memory device dies. Each LUN in a particular memory target, such as one of memory targets 201-208, might share the same chip enable signal (e.g., all of the LUNs in memory target 201 might share chip enable signal $\overline{CE0}$) so that each logical unit in that memory target is accessed by a respective address bit to distinguish the multiple LUNs (e.g., multiple dies) in the target. The multiple LUNs may operate in parallel on different commands at the same time.

Each expander block 104-106 incorporates an extra communication channel 110-112 that is used as a RAID channel by the controller 101. The RAID channel is coupled to one or more additional memory targets that are used by the system controller 101 for storing data redundant to that stored in other targets coupled to that expander block for each of the other communication channels coupled to that expander block.

Since NAND flash memory targets do not typically have address pins, addresses are loaded through a five-cycle sequence during command processing. Two address types are used: a column address and a row address. The column address is used to access bytes or words within a page. The row address is used to address pages, blocks, and/or LUNs. The row address structure, in one embodiment, is comprised of lower order row address bits for page addressing, middle row address bits for block addressing, and the most significant row address bits for LUN addressing.

FIG. 2 illustrates a block diagram of one embodiment of an expander block communication channel 100 comprising a plurality of memory targets 201-208. This figure shows the address/data bus 210, Read/Write control signal 211, and chip enable signals 212 that make up one of the expander block communication channels. The illustrated embodiment includes eight separate memory targets so that eight chip enable signals ($\overline{CE0}$-$\overline{CE7}$) are used. In FIG. 2, each of the memory targets are depicted as respective memory device 201-208 (e.g., respective separate die) which may be stacked with one or more of the other memory devices.

The embodiment of FIG. 2 is for purposes of illustration only. A solid state storage system may use only one memory device 201 or multiple memory devices. For example, a solid state storage system could be comprised of thousands of non-volatile memory devices organized into groups of non-volatile memory devices 201, 202 in which each memory device in the target shares a single chip enable line. Each of the plurality of chip enable lines are coupled to a different group of non-volatile memory devices.

Figure 3:
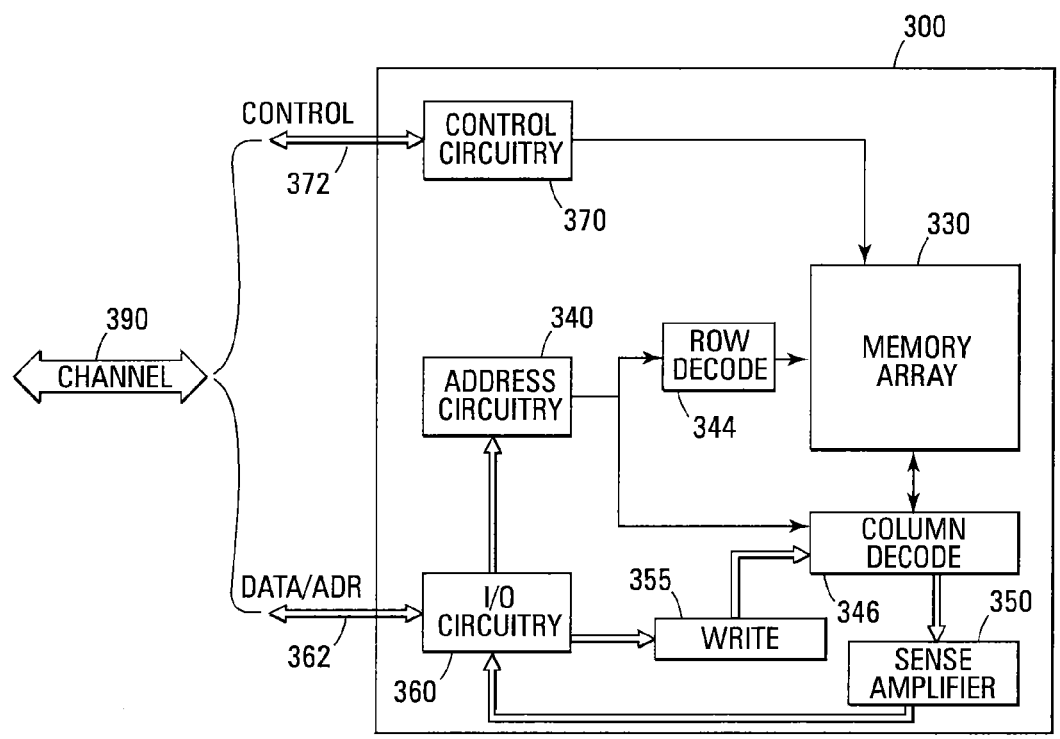
FIG. 3 shows a block diagram of one embodiment of a non-volatile memory device that uses a memory communication channel.

FIG. 3 illustrates a functional block diagram of a single LUN, such as a non-volatile memory device 300 that can be incorporated on an integrated circuit die. The non-volatile memory device 300, in one embodiment, is a NAND flash memory. The non-volatile memory device 300 has been simplified to focus on features of the memory that are helpful in understanding the present programming embodiments.

Figure 4:
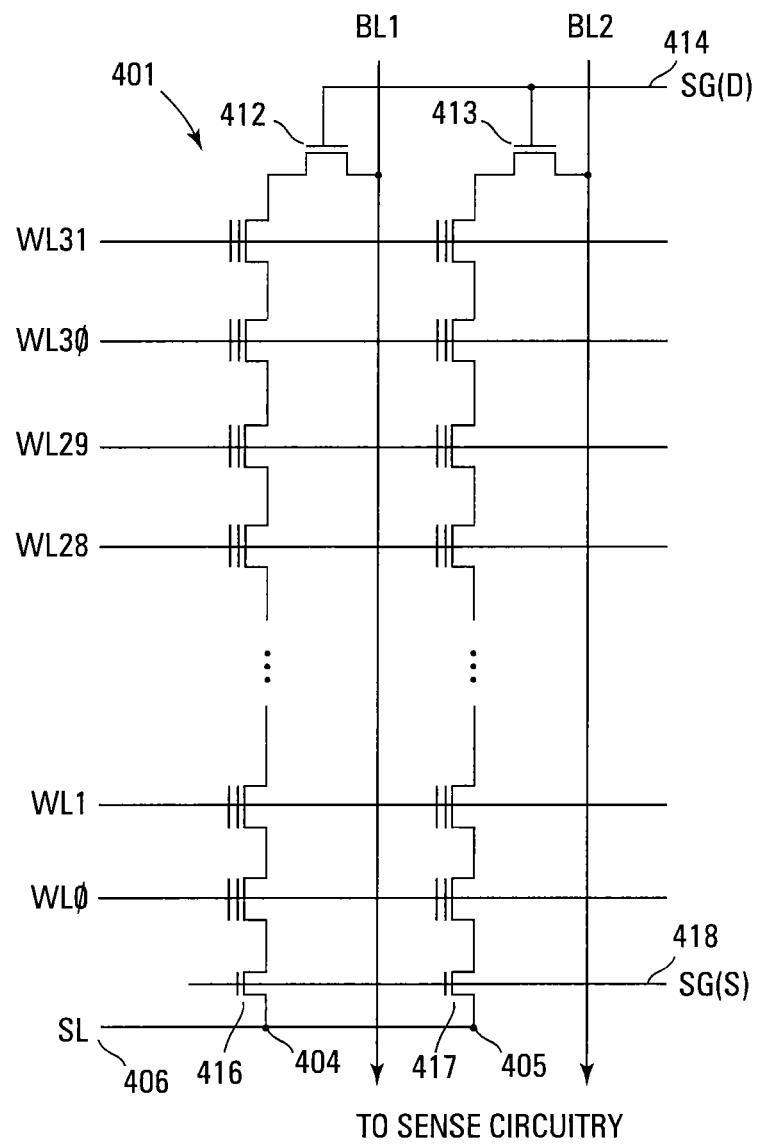
FIG. 4 shows a schematic diagram of one embodiment of a portion of a non-volatile memory array in accordance with a non-volatile memory device of FIG. 3.

The non-volatile memory device 300 includes an array 330 of non-volatile memory cells such as the floating gate memory cells that are illustrated in FIG. 4 and discussed previously. The memory array 330 is arranged in banks of access line (e.g., word line) rows and data line (e.g., bit line) columns. In one embodiment, the columns of the memory array 330 are comprised of series strings of memory cells. As is well known in the art, the connections of the cells to the bit lines determines whether the array is a NAND architecture, an AND architecture, or a NOR architecture.

The memory array 330 can be organized into memory blocks. The quantity of memory blocks is typically determined by the size of the memory device (i.e., 512 MB, 1 GB). In one embodiment, each memory block can be organized into 64 pages of single level cells (SLC). In an alternate embodiment, each memory block can be organized into 128 pages of multiple level cells (MLC). Each page of data, in one embodiment, can be comprised of 2048 bytes of data on 32 word lines.

Address buffer circuitry 340 is provided to latch address signals provided through the I/O circuitry 360. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts. Data is also input and output through the I/O circuitry 360 based on the timing of the control signals provided on control bus 372.

The non-volatile memory device 300 reads data in the memory array 330 by a sense operation that senses voltage or current changes in the memory array columns using sense circuitry 350. The sense circuitry 350, in one embodiment, is coupled to read and latch a row of data from the memory array 330. Data input and output buffer circuitry 360 is included for bidirectional data communication as well as address communication over a plurality of data connections 362 with an external controller. Write circuitry 355 is provided to write data to the memory array.

The memory control circuitry 370 decodes signals provided on control bus 372 from an external controller and/or expander block. These signals can include read/write (R/W), chip enable (CE), command latch enable (CLE), address latch enable (ALE) as well as other control signals that are used to control the operations on the memory array 330 as well as other circuitry of the memory device 300. In one embodiment, these signals are active low but alternate embodiments can use active high signals. The memory control circuitry 370 may be a state machine, a sequencer, or some other type of controller to generate the memory control signals.

The non-volatile memory device 300 communicates with an external controller and/or expander block over a channel 390. In one embodiment, the channel 390 is comprised of the memory address, data, and control signals between the external controller and/or expander block and the memory device 300. The embodiment of FIG. 3 shows the address and data being coupled as one bus to the I/O circuitry 360. In an alternate embodiment, the address and data buses are separate inputs/outputs with the memory device 300.

FIG. 4 illustrates a schematic diagram of a portion of a NAND architecture memory array comprising series strings of non-volatile memory cells. While the subsequent discussions refer to a NAND memory device, the present embodiments are not limited to such an architecture.

The memory array is comprised of an array of non-volatile memory cells 401 (e.g., floating gate) arranged in columns such as series strings 404, 405. Each of the cells 401 are coupled drain to source in each series string 404, 405. A word line WL0-WL31 that spans across multiple series strings 404, 405 is connected to the control gates of each memory cell in a row in order to bias the control gates of the memory cells in the row. Bit lines BL1, BL2 are eventually connected to sense circuitry (not shown) that detect the state of each cell by sensing current on a particular bit line.

Each series string 404, 405 of memory cells is coupled to a source line 406 by a source select gate 416, 417 and to an individual bit line BL1, BL2 by a drain select gate 412, 413. The source select gates 416, 417 are controlled by a source select gate control line SG(S) 418 coupled to their control gates. The drain select gates 412, 413 are controlled by a drain select gate control line SG(D) 414.

Each memory cell can be programmed as an SLC device or an MLC device. Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges that each indicate a different state. Multiple level cells can take advantage of the analog nature of a traditional flash cell by assigning a bit pattern to a specific voltage range stored on the cell. This technology permits the storage of two or more bits per cell, depending on the quantity of voltage ranges assigned to the cell.

Redundant Array of Independent Disks (RAID) is a technology that employs the simultaneous use of two or more media (e.g., non-volatile memory devices) to achieve greater levels of performance, reliability, and/or larger data volume sizes. The RAID support provided by the solid state storage system of FIG. 1 divides and/or replicates data among multiple memory targets that are addressed in unison. The multiple memory targets are seen by a computer operating system coupled to the solid state storage system of FIG. 1 as one single hard disk drive.

The solid state storage system of FIG. 1 can use a page addressing mode so that the expander blocks provide data protection by employing RAID-type hardware support. With the RAID function, corresponding pages in multiple memory targets are addressed in unison. These pages may not be located at the same physical address within each of the memory targets but the translated (i.e., logical) address at which the controller has positioned the data are associated together so that they are programmed and read in unison. There is a one-to-one correspondence across the RAID codeword. The system uses the RAID functions to provide data back-up in that if a failure is experienced in one memory target, the data that was stored in that memory target can be recovered, for example, by using the corresponding page data and the associated RAID data (e.g., redundancy data) in the corresponding memory targets.

In order to recover the data from the memory target experiencing the failure, the failed target is identified. In one embodiment, the error detection is accomplished by memory control circuitry receiving an error correction coding error that is not correctable after subsequent failed attempts to read the bad page.

Figure 5:
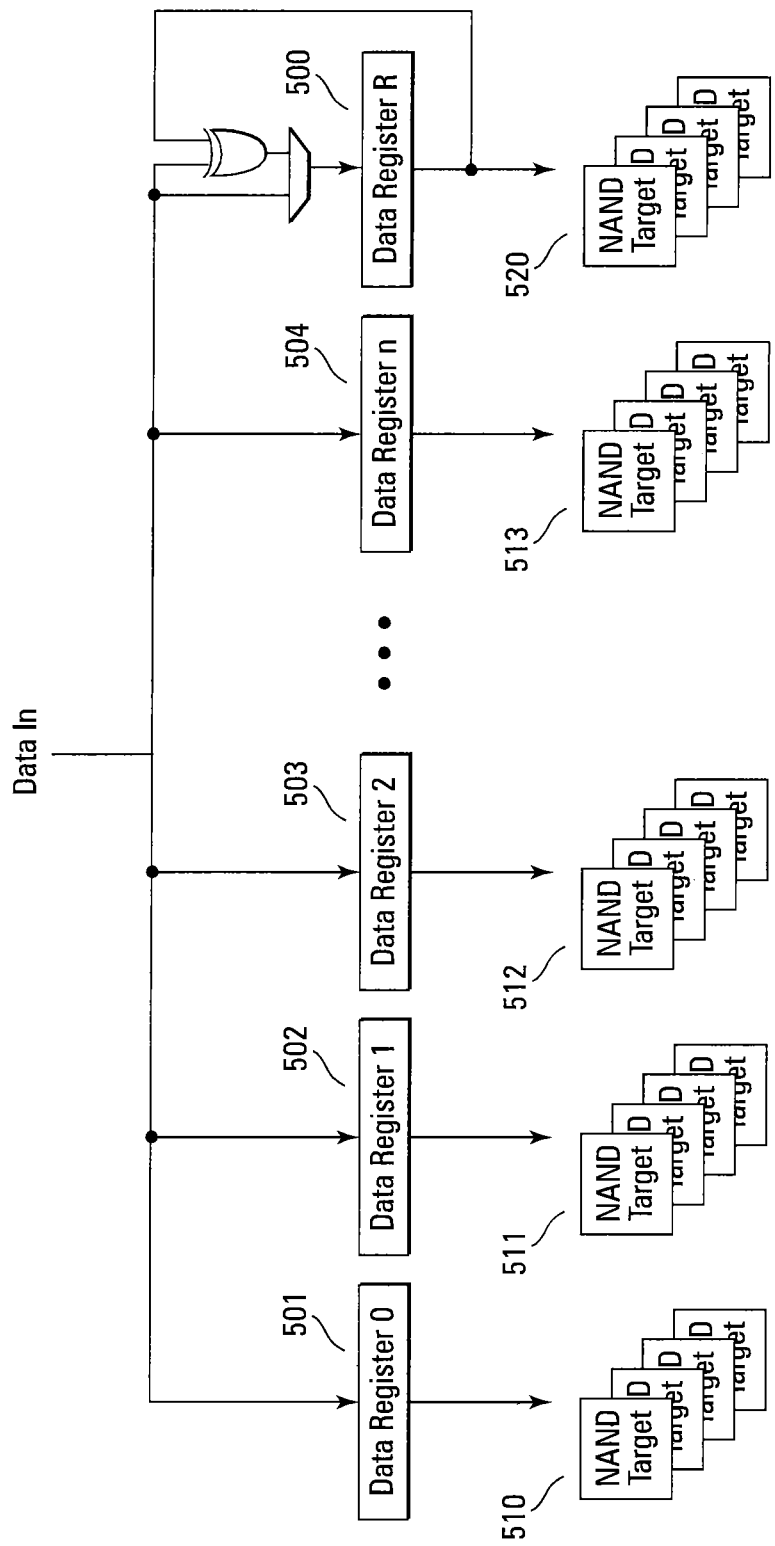
FIG. 5 shows a conceptual block diagram of one embodiment of a data programming operation utilizing RAID functions.

FIG. 5 illustrates a conceptual block diagram of a data programming operation utilizing the RAID functions of FIG. 1. In this figure, each data register 0-n (501-504) represents a different expander block communication channel coupled to a separate group of memory targets. Each group of memory targets 510-513 is associated with a different expander block communication channel.

RAID channel register 500 is part of the RAID channel that stores the RAID redundancy data. This RAID channel has its own associated group of memory targets 520 for storing the RAID redundancy data. FIG. 5 shows that as the data to be programmed to a respective memory target in each of groups 510-513 is sequentially written into the expander registers 501-504, the RAID redundancy data is calculated and stored in RAID channel register 500. After all of the page data is received and moved to the expander registers 501-504, the same addresses in the corresponding memory targets are programmed in unison. The programming can be performed on only a subset of the memory targets and is not required to be performed on all of the memory targets of the system.

A typical error condition may not include an entire memory target experiencing the failure. A failure may simply be only a page or block of a location that cannot be read. When single pages or blocks are found to be unreadable, the target control circuitry can set and clear the notification to its associated expander. If an entire memory device/die/LUN is found to be unreadable, the error notification may be left on continuously when the failed location is being accessed.

Figure 6:
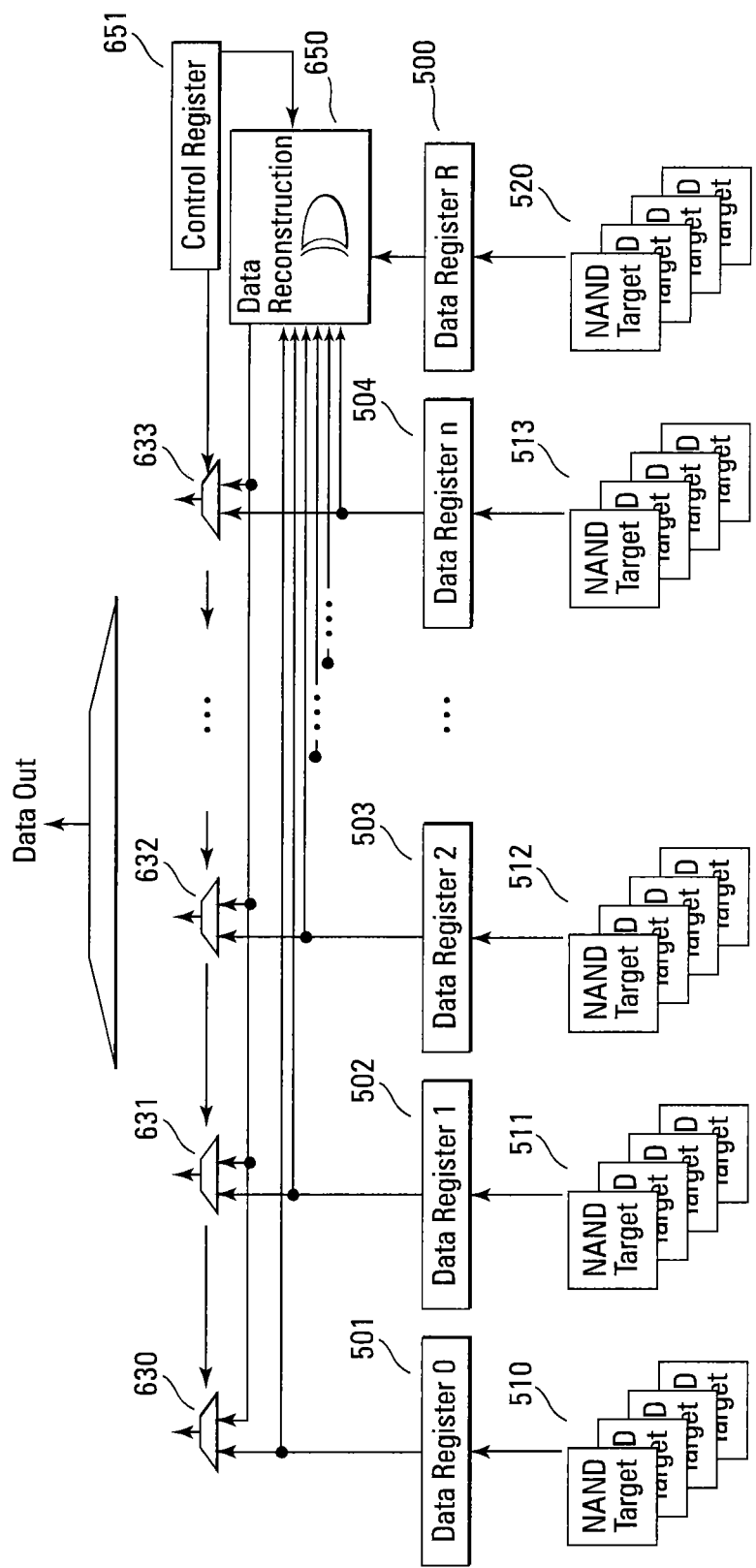
FIG. 6 shows a conceptual block diagram of one embodiment of a RAID read page and data reconstruction.

The defective data is corrected by using the remaining good data, including the data from the RAID channels, and performing a bit-wise exclusive OR (XOR) operation of the same memory addresses in each memory target. Since the failed memory location is known, it is excluded from the XOR operation. A conceptual block diagram of data read and reconstruction operation is illustrated in FIG. 6.

The data from each corresponding memory target in each of groups 510-513 can be substantially simultaneously written into the expander registers 501-504. The RAID redundancy data from the memory target in RAID group 520 is also written into the RAID channel register 500 at this time. As the data is received from the targets, it can be serially read by the system controller. If it has been determined that the data cannot be read from a particular target and an associated status bit has been set in the control register 651, as the data is re-read it is reconstructed by an XOR operation 650 of the remaining good data, excluding the failed memory location. The XOR operation 650 is performed on the data from corresponding locations in each accessed memory target, including the corresponding memory target in RAID group 520.

For example, if a page of data starting at location 003Fh of one memory target in group 512 is found to have failed, the XOR operation is performed on the pages of data starting at location 003Fh of each of the other groups 510, 511, 513, and 520 coupled to the expander block. The XOR operation can be performed by data reconstruction logic 650 or a controller performing an XOR operation. The reconstructed data can then be passed to the system controller through the combination logic 630-633 with the other data.

The expander block associated with the failed memory device is notified of the failed read operation. In one embodiment, this is accomplished by the associated expander block receiving a command that specifically identifies the particular channel that is associated with the memory device that cannot be read. Once the associated expander block is informed of the failed channel, the memory control circuitry of the memory device that has failed can issue a re-read of the failed page. The data can then be read without regard to the fact that data for the failed memory device will be reconstructed by the expander block. There is no impact on performance when reading reconstructed data.

Figure 7:
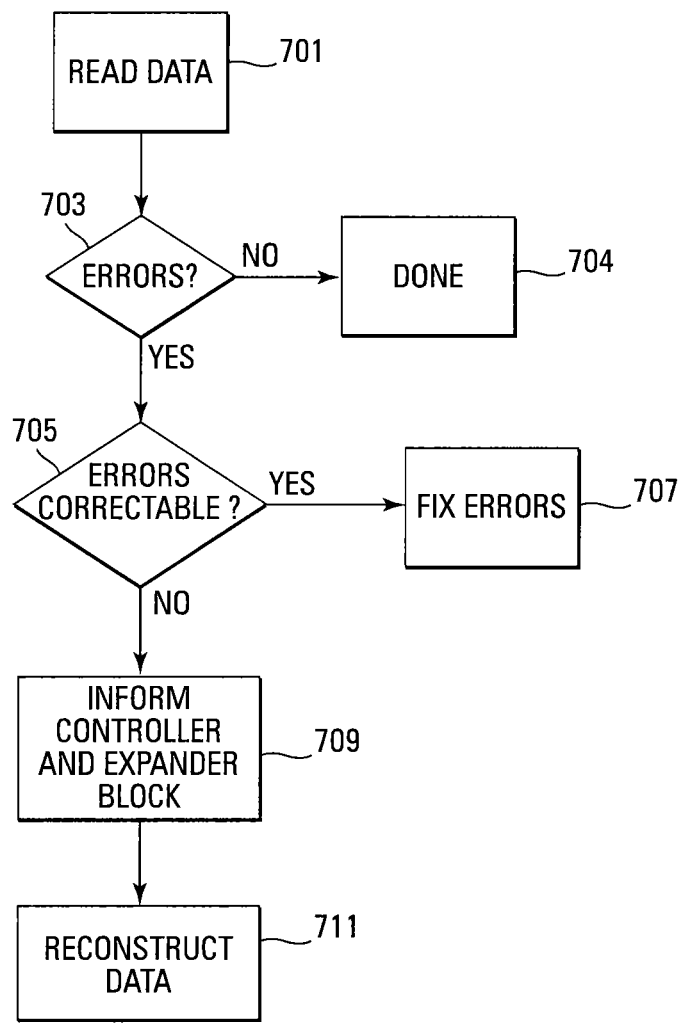
FIG. 7 shows a flowchart of one embodiment of a method for data recovery in a solid state storage system in accordance with the system of FIG. 1.

FIG. 7 illustrates a flowchart of one embodiment of a method for data recovery in a solid state storage system, such as the system of FIG. 1. The method can be executed by the solid state storage system controller, any of the individual memory device control circuitry, or any other controller. The method involves detection by a controller that the data stored in a particular memory target cannot be correctly read back out and has too many errors for correction by an error correction coding (ECC) scheme (e.g., Hamming code, BCH code, Turbo code, LDPC code, Reed-Muller code, Binary Golay code, Trellis Code Modulation).

The method begins by reading data into the appropriate controller 701. In one embodiment, a page of data is read into the controller. Alternate embodiments might read in other amounts of data. The controller then determines if the data is correct 703. This determination can be performed by an ECC verification, a parity check or some other error checking scheme.

If the data does not contain errors, the method is done 704. If the data has errors, it is determined if the errors can be corrected by an ECC 705. If the number of errors is less than or equal to the ECC threshold, the errors are corrected 707. If the number of errors in the data is more than can be corrected by the ECC scheme, the controller and the associated expander block are informed that the data has been found to be unrecoverable 709. This can be accomplished by setting a bit in a control register, sending a command to the control circuitry of the memory target in which the defective data is stored, and/or sending an error indication to the system controller. The error indication can inform the controller that a particular cell is bad, a particular page is bad, a particular block is bad, or an entire memory device is bad.

When the data is unrecoverable by ECC, the defective data is reconstructed by performing a bit-wise XOR operation on the remaining good data and the RAID redundancy data 711 as described with reference to FIG. 6. The location of the defective data can be used by the controller performing the operation to know which target's data stream to exclude from the XOR operation and to which page the regenerated data should be associated. The same addresses of each corresponding memory target coupled to a particular expander block are XOR'ed during the data regeneration process.

CONCLUSION

In summary, one or more embodiments of the present invention provide a method for recovering defective data in a memory system such as a solid state drive. Once the location of the defective data is known, good data can be XOR'ed with RAID data to reconstruct the defective data. The defective data is excluded from this logical combining operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A system comprising:
 a controller having a plurality of communication channels;
 a plurality of memories coupled to the controller; and
 a plurality of expander blocks, each of the expander blocks coupling a respective one of different subsets of memories to a respective one of the plurality of communication channels of the controller;
 wherein the system is configured to perform a data recovery operation for defective data read from a location in one of the memories by logically combining data read from corresponding locations in other ones of the memories, wherein the defective data are excluded from the logical combining; and
 wherein each of the expander blocks has a plurality of expander block communication channels and each expander block communication channel is coupled to a respective one of the memories of the respective subset of memories, wherein each of the expander block communication channels comprise a Redundant Array of Independent Disks (RAID) channel coupled to a RAID register.

2. The system of claim 1 wherein each of the plurality of communication channels comprises a plurality of chip enable signals.

3. The system of claim 2 wherein each chip enable signal is coupled to a different one of the memories.

4. The system of claim 1 wherein the controller is configured to emulate a hard disk drive.

5. The system of claim 1 wherein each of the memories is a non-volatile memory package that comprises a plurality of non-volatile memory dies.

6. The system of claim 1 wherein each of the memories comprise memory control circuitry that is configured to perform error detection and the data recovery operation on data read from a memory associated with the memory control circuitry.

7. The system of claim 1 wherein the controller comprises an I/O interface configured to communicate with an external system and the controller is further configured to handle standardized bus communication signals between the system and the external system.

8. The system of claim 1 wherein the memories comprise multiple level cell memory.

9. A method for data recovery in a system, the method comprising:
 programming, to a RAID channel register associated with a set of memories, RAID data associated with data that is programmed in the set of memories;
 determining data to be defective at a location within a memory of the set of memories in the system; and
 logically combining data from a corresponding location in corresponding memories of the set of memories in the system to reconstruct the data determined to be defective wherein the memory having the defective data is excluded from the logically combining.

10. The method of claim 9 and further comprising attempting to correct the defective data with an error correction code prior to logically combining the data from the corresponding location in corresponding memories.

11. The method of claim 10 and further comprising informing a controller performing the data recovery and an expander block associated with the set of memories when the defective data cannot be corrected with the error correction code.

12. The method of claim 11 wherein informing the control circuitry and the expander block comprises one of: setting a bit in a control register, sending a command to the control circuitry, or sending an error indication to a system controller for the system.

13. The method of claim 9 wherein determining the data to be defective at the location comprises:
 reading data from the location; and
 detecting an error after reading data from the location.

14. The method of claim 13 wherein reading the data comprises reading a page of data.

15. The method of claim 13 wherein logically combining comprises XORing the data read from the corresponding location in each of the corresponding memories.

16. The method of claim 9 wherein logically combining comprises performing a bit-wise XOR operation on the data from the corresponding location in corresponding memories of the set of memories, excluding the defective data, with the RAID data associated with the data from the corresponding location in corresponding memories of the set of memories.

17. A method for data recovery in a system having a plurality of memories, the method comprising:
programming, to a RAID register associated with a set of memories, RAID data for data that has been programmed to a particular set of memories of the plurality of memories;
reading data from corresponding locations in the particular set of memories;
determining if the read data from the corresponding locations of the particular set of memories comprises errors;
attempting to correct any errors in the read data with error correction code; and
performing a bit-wise exclusive OR operation on the data from the corresponding locations and associated RAID data only when the errors cannot be corrected with the error correction code, wherein the bit-wise exclusive OR operation excludes the read data comprising errors.

18. The method of claim 17 wherein the system comprises an expander block coupled to the particular set of memories and the corresponding locations in the particular set of memories comprise a same address of each memory of the particular set of memories coupled to the expander block.

19. The method of claim 18 and further comprising programming regenerated date from the exclusive OR operation to an address associated with the corresponding locations of a memory coupled to the expander block.

* * * * *

UNITED STATES PATENT AND TRADEMARK OFFICE
CERTIFICATE OF CORRECTION

| | | |
|---|---|---|
| PATENT NO. | : 8,732,549 B2 | Page 1 of 1 |
| APPLICATION NO. | : 13/678934 | |
| DATED | : May 20, 2014 | |
| INVENTOR(S) | : Larsen et al. | |

It is certified that error appears in the above-identified patent and that said Letters Patent is hereby corrected as shown below:

On the Title Page Item (72) under "Inventors", in column 1, Line 1, delete "Larsen Troy" and insert --Troy Larsen--

Signed and Sealed this
Tenth Day of November, 2015

Michelle K. Lee
*Director of the United States Patent and Trademark Office*